United States Patent
Lee et al.

(10) Patent No.: US 8,223,248 B2
(45) Date of Patent: Jul. 17, 2012

(54) IMAGE SENSOR MODULE HAVING A SEMICONDUCTOR CHIP, A HOLDER AND A COUPLING MEMBER

(75) Inventors: Seung Hyun Lee, Gyeonggi-do (KR); Chan Ki Hwang, Seoul (KR); Seung Ho Lee, Gyeonggi-do (KR); Hee Jin Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 385 days.

(21) Appl. No.: 12/491,412

(22) Filed: Jun. 25, 2009

(65) Prior Publication Data
US 2010/0259657 A1    Oct. 14, 2010

(30) Foreign Application Priority Data
Apr. 10, 2009 (KR) .................. 10-2009-0031415

(51) Int. Cl.
*H04N 5/225* (2006.01)
*H01L 21/00* (2006.01)
*H01L 31/0232* (2006.01)

(52) U.S. Cl. ................. 348/340; 438/64; 257/432
(58) Field of Classification Search .......... 348/340; 257/432–433, 435; 438/64
See application file for complete search history.

(56) References Cited

U.S. PATENT DOCUMENTS

| 2005/0146632 A1* | 7/2005 | Wataya ............ 348/340 |
| 2005/0275741 A1* | 12/2005 | Watanabe et al. ...... 348/340 |
| 2007/0236596 A1* | 10/2007 | Sekine et al. ......... 348/340 |
| 2008/0252771 A1* | 10/2008 | Wu ............. 348/340 |
| 2008/0278621 A1* | 11/2008 | Cho et al. ......... 348/374 |
| 2009/0051023 A1* | 2/2009 | Nam et al. ............ 257/686 |

FOREIGN PATENT DOCUMENTS

| JP | 2007-181212 A | 7/2007 |
| KR | 1020080035387 A | 4/2008 |
| KR | 1020080079086 A | 8/2008 |

* cited by examiner

*Primary Examiner* — Kelly L Jerabek
(74) *Attorney, Agent, or Firm* — Ladas & Parry LLP

(57) ABSTRACT

An image sensor module is presented which includes a semiconductor chip, a holder and a coupling member. The semiconductor chip has a semiconductor chip body; an image sensing section over the semiconductor chip body; and bonding pads on the semiconductor chip body. The holder is mounted over the semiconductor chip and has an insulation section over the semiconductor chip body; connection patterns on the insulation section which are electrically coupled to the bonding pads; and a transparent cover over the image sensing section which is connected to the insulation section. The coupling member is interposed between the holder and the semiconductor chip for coupling together the holder to the semiconductor chip.

20 Claims, 6 Drawing Sheets

IMAGE SENSOR MODULE HAVING A SEMICONDUCTOR CHIP, A HOLDER AND A COUPLING MEMBER

CROSS-REFERENCE TO RELATED APPLICATIONS

The present application claims priority to Korean patent application number 10-2009-0031415 filed on Apr. 10, 2009, which is incorporated herein by reference in its entirety.

BACKGROUND OF THE INVENTION

The present invention relates generally to digital image devices, and more particularly to an image sensor module which is configured so that the manufacturing time is reduced.

In general, an image sensor module produces digital image by detecting light incident on semiconductor devices. The image sensor module can be mounted onto digital cameras, notebook computers, etc. Moving picture or still image can be realized using the image sensor module.

The image sensor module includes a semiconductor chip having semiconductor devices, and a substrate on which the semiconductor chip is mounted. The semiconductor chip and the substrate are electrically connected together by conductive wires.

In the situation where the semiconductor chip and the substrate are configured to be electrically connected together by the conductive wires, a substantial amount time is required to manufacture the image sensor module when the image sensor module is large.

BRIEF SUMMARY OF THE INVENTION

Embodiments of the present invention are directed to an image sensor module which is suitable for shortening a manufacturing time and reducing the size of the image sensor module.

In one aspect of the present invention, an image sensor module comprises a semiconductor chip having a semiconductor chip body, an image sensing section which is placed on an upper surface of the semiconductor chip body, and bonding pads which are placed on the upper surface of the semiconductor chip body; a holder placed on the semiconductor chip and having an insulation section which is placed perpendicularly to the upper surface of the semiconductor chip body, connection patterns which are placed on a lower surface of the insulation section and are electrically connected with the bonding pads, and a transparent cover which faces the image sensing section and is coupled to the insulation section; and a coupling member interposed between the holder and the semiconductor chip to couple the holder to the semiconductor chip.

The coupling member comprises any one of a nonconductive adhesive (NCA), a nonconductive film (NCF), and an anisotropic conductive film (ACF).

The image sensor module further comprises bumps respectively interposed between the bonding pads and the connection patterns and electrically connecting the bonding pads and the connection patterns with each other.

The insulation section includes an optical element such as a filter and a lens secured within the insulation section.

The image sensor module further comprises a substrate placed on a lower surface of the semiconductor chip body which faces away from the upper surface, and having connection pads which are electrically connected with the connection patterns.

The semiconductor chip can be received and nested within a receiving groove of the substrate.

The substrate can be a flexible substrate.

The insulation section includes a bottom plate which is bent inward where the insulation section and the semiconductor chip body come into contact with each other, and the connection patterns include first connection pattern parts which are formed on a lower surface of the bottom plate and second connection pattern parts which extend from the first connection pattern parts to side surfaces of the bottom plate.

The image sensor module further comprises connection members electrically connecting the second connection pattern parts and the connection pads of the substrate with each other.

The insulation section includes a bottom plate which is bent outward and projects out of the semiconductor chip where the insulation section and the semiconductor chip body come into contact with each other, and the connection pads and the bonding pads are electrically connected with each other by the connection patterns which are placed on a lower surface of the bottom plate.

The insulation section includes a bottom plate which is bent inward and outward where the insulation section and the semiconductor chip body come into contact with each other, and the connection pads and the bonding pads are electrically connected together by the connection patterns which are placed on a lower surface of the bottom plate.

The image sensor module further comprises ball lands electrically connected with the respective bonding pads and placed on the lower of the semiconductor chip body which faces away from the upper surface; and conductive members connected with the ball lands.

The image sensor module further comprises through-electrodes passing through the semiconductor chip to electrically connect the bonding pads and the ball lands with each other.

In another aspect of the present invention, an image sensor module comprises a semiconductor chip having a semiconductor chip body, an image sensing section which is placed on an upper surface of the semiconductor chip body, and bonding pads which are placed on the upper surface of the semiconductor chip body; a substrate allowing the semiconductor chip to be placed thereon and having connection pads which correspond to the respective bonding pads; a holder placed on the semiconductor chip and having an insulation section which is erected on the semiconductor chip, a bottom plate which is connected with the insulation section and is placed parallel to the semiconductor chip, connection patterns which are placed on a lower surface of the bottom plate and electrically connect the bonding pads and the connection pads corresponding to the respective bonding pads, and a transparent cover which faces the image sensing section and is coupled to the insulation section; and a coupling member interposed between the holder and the semiconductor chip to couple the holder to the semiconductor chip.

The coupling member comprises any one of a nonconductive adhesive (NCA), a nonconductive film (NCF), and an anisotropic conductive film (ACF).

The image sensor module further comprises bumps respectively interposed between the bonding pads and the connection patterns and electrically connecting the bonding pads and the connection patterns with each other.

The substrate has a receiving groove for receiving the semiconductor chip.

DESCRIPTION OF SPECIFIC EMBODIMENTS

It is understood herein that the drawings are not necessarily to scale and in some instances proportions may have been exaggerated in order to more clearly depict certain features of the invention. An image sensor module according to the present invention includes a semiconductor chip, a holder, and a coupling member.

The semiconductor chip includes a semiconductor chip body, an image sensing section which is placed on the upper surface of the semiconductor chip body, and bonding pads which are placed along the edges of the upper surface.

The holder includes an insulation section which is placed along the edges perpendicularly to the upper surface, connection patterns which are placed on the lower surface of the insulation section and are electrically connected with the bonding pads, and a transparent cover which faces the image sensing section and is coupled to the insulation section.

The coupling member couples the insulation section to the semiconductor chip body. The image sensing section is sealed by the coupling member.

Hereafter, image sensor modules in accordance with various specific embodiments of the present invention will be described with reference to the accompanying drawings.

Figure 1:
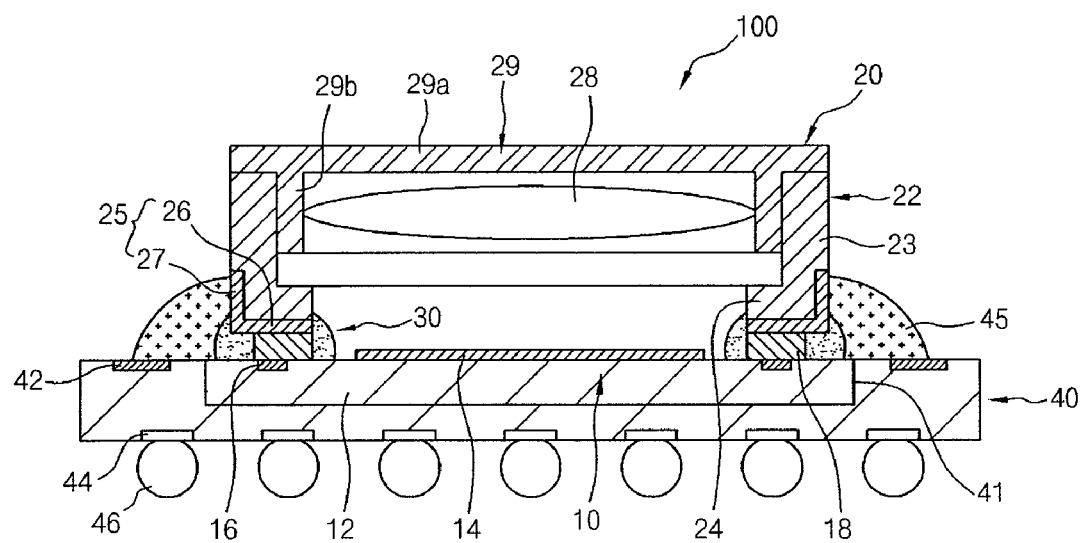
FIG. 1 is a sectional view illustrating an image sensor module in accordance with a first embodiment of the present invention.

FIG. 1 is a sectional view illustrating an image sensor module in accordance with a first embodiment of the present invention.

Referring to FIG. 1, an image sensor module 100 includes a semiconductor chip 10, a holder 20 and a coupling member 30. The image sensor module 100 can further include a substrate 40.

Figure 2:
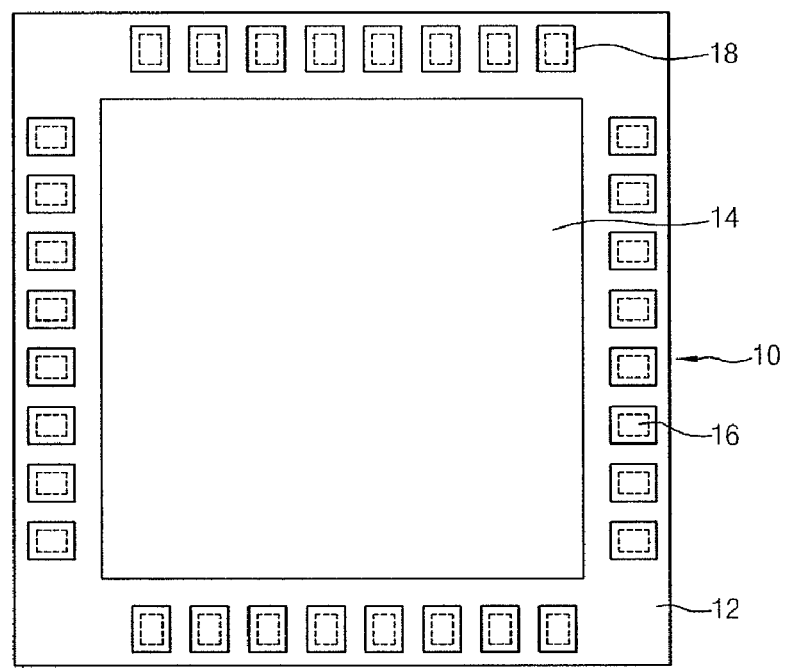
FIG. 2 is a plan view illustrating the semiconductor chip shown in FIG. 1.

FIG. 2 is a plan view illustrating the semiconductor chip shown in FIG. 1.

Referring to FIG. 2, the semiconductor chip 10 includes a semiconductor chip body 12, an image sensing section 14 and bonding pads 16. In the present embodiment, the semiconductor chip 10 can further include bumps 18.

The semiconductor chip body 12 may be configured in any known geometric shape in which one preferred configuration is that the semiconductor chip body 12 can have a rectangular hexahedron shape. In the preferred embodiment the semiconductor chip body 12 having the rectangular hexahedron shape has an upper surface and a lower surface which faces away from the upper surface.

The image sensing section 14 can be placed anywhere on the semiconductor chip body 12 in which it is preferred that the image sensing section 14 is placed substantially at the center portion of the upper surface of the semiconductor chip body 12. The image sensing section 14 includes a plurality of photodiodes (not shown) and a driving unit (not shown) which comprises a plurality of transistors for driving the photodiodes.

The bonding pads 16 can also be placed anywhere on the semiconductor chip body in which it is preferred that the bonding pads 16 are placed on the upper surface of the semiconductor chip body 12. One preferred embodiment is that the bonding pads 16 are placed along the peripheries of the image sensing section 14. In detail, the bonding pads 16 can be placed along the edges of the upper surface of the semiconductor chip body 12.

The bumps 18 are placed on the respective bonding pads 16. The bumps 18 preferably comprise gold bumps and/or nickel bumps.

Figure 3:
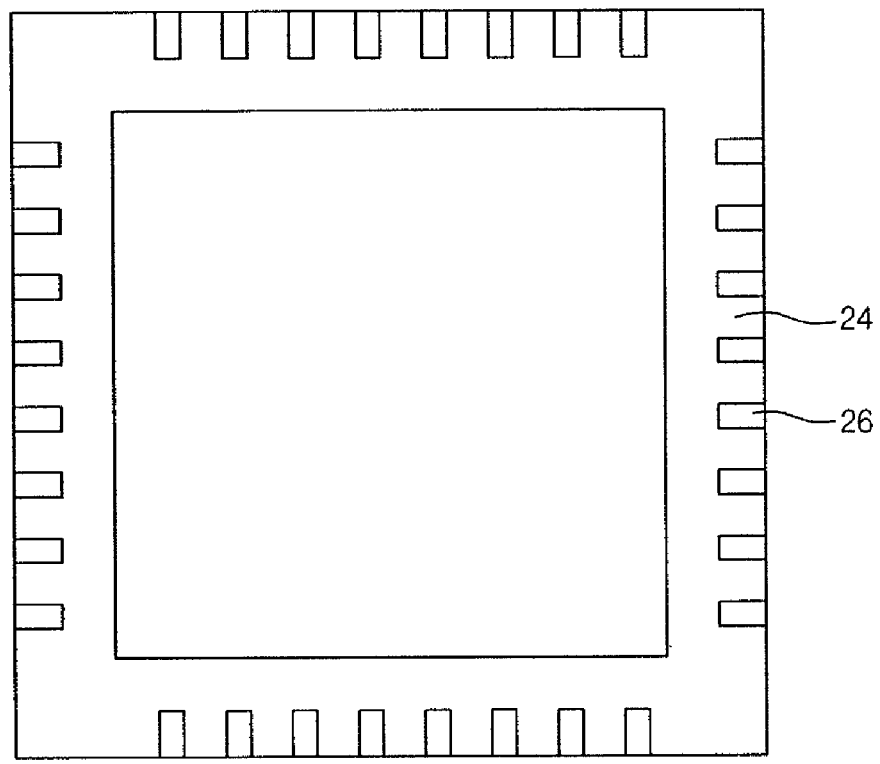
FIG. 3 is a bottom view illustrating an insulation section shown in FIG. 1.
Figure 4:
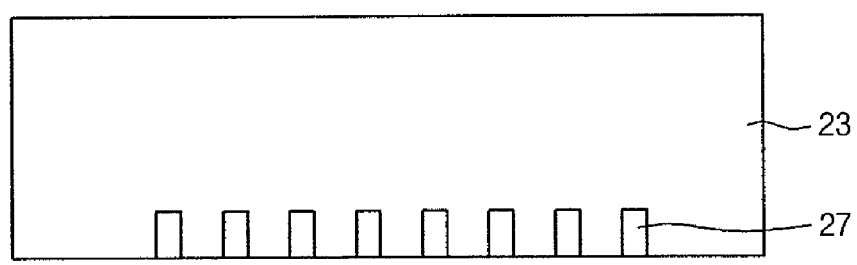
FIG. 4 is a side view illustrating the insulation section shown in FIG. 1.

FIG. 3 is a bottom view illustrating an insulation section shown in FIG. 1. FIG. 4 is a side view illustrating the insulation section shown in FIG. 1.

Referring back to FIG. 1, the holder 20 is placed over the semiconductor chip 10. The holder 20 includes an insulation section 22, connection patterns 25 and a transparent cover 29.

Referring now to FIGS. 3 and 4, the insulation section 22 may have any known geometric shape in which it is preferred that the insulation section 22 has a hollow rectangular frame shape that has open upper and lower ends. As shown, the insulation section 22 has sidewalls 23 and a bottom plate 24. The bottom plate 24 may be have any shape in which it is preferred that the bottom plate 24 is shaped so as to appear as if it is formed by bending inward the lower end portions of the sidewalls 23 to face the semiconductor chip 10.

The sidewalls 23 of the insulation section 22 are placed along the edges of the upper surface of the semiconductor chip body 12. There may be any number of sidewalls 23, however it is preferred that there are only four sidewalls 23. The four sidewalls 23 of the insulation section 22 are connected with one another. The respective sidewalls 23 are preferably placed substantially perpendicular to the upper surface of the semiconductor chip body 12. For example, the insulation section 22 can be made of any type of insulation material. Although it was illustrated and described in the present embodiment that the insulation section 22 possesses the shape of a hollow rectangular frame, the insulation section 22 can be shaped in other configurations such as being shaped as a hollow cylinder shaped frame, a hollow ellipse shaped frame, a hollow diamond shaped frame, a hollow triangular shaped frame, a hollow pentagonal and a hollow hexagonal shaped frame.

At least one optical element 28 such as a simple lens, compound lens, a neutral density (ND) filter, an antireflection filter, a polarizing filter, an ultraviolet (UV) cutoff filter, a color filter or an infrared (IR) filter can be securely placed within the confines of the sidewalls 23 of the insulation section 22.

The connection patterns 25 can have any known shape and geometric configuration. One preferred configuration is that the connection patterns 25 include first connection pattern parts 26 and second connection pattern parts 27. The first connection pattern parts 26 are preferably placed on the lower surface of the bottom plate 24 of the insulation section 22, and the second connection pattern parts 27 are preferably placed along the side surfaces of the bottom plate 24 of the insulation section 22. The respective first and second connection pattern parts 26, 27 of each connection pattern 25 are preferably electrically connected with each other. Thus, when viewed in section in FIG. 1, the connection patterns 25 have an 'L' shape.

In the present embodiment, the first connection patterns parts 26 of the connection patterns 25 are placed over the lower surface of the bottom plate 24 at positions corresponding to the respective bumps 18 of the semiconductor chip 10. Therefore, each first connection pattern parts 26 are respectively placed over corresponding bumps 18 of the semiconductor chip 10.

The transparent cover 29 may have any shape and geometric configuration. One preferred transparent cover 29 is that it has a cover part 29a and a coupling part 29b.

The cover part 29a is preferably transparent and has a plate shape. The cover part 29a is also preferably aligned to face the image sensing section 14 of the semiconductor chip 10. The coupling part 29b extends from the cover part 29a and is preferably fitted onto the sidewalls 23 so that the cover part 29a is inside the insulation section 22.

The transparent cover 29 preferably prevents or at least minimizes the occurrence of foreign substances from being introduced into and onto the image sensing section 14. The transparent cover 29 preferably allows external light rays to reach the image sensing section 14.

The coupling member 30 physically and/or electrically couples together the connection patterns 25 to their corresponding respective bumps 18 of the semiconductor chip 10. In the present embodiment, the coupling member 30 is formed in the form of a closed continuous line along the bottom plate 24 of the insulation section 22. Accordingly, the coupling member 30 prevents or at least minimizes the occurrence of external contaminants from entering into the holder 20 and onto the image sensing section 14, thereby preventing or minimizing unwanted contamination from external sources.

The coupling member 30 in the present embodiment may be made of any type of material as long as it physically and/or electrically couples together the connection patterns 25 to their corresponding respective bumps 18 of the semiconductor chip 10. Examples of materials which can be used to form the coupling member 30 include a nonconductive adhesive (NCA), a nonconductive film (NCF), and an anisotropic conductive film (ACF).

The substrate 40 is coupled to the semiconductor chip 10. The substrate 40 and the semiconductor chip 10 are electrically connected with each other.

In the present illustrative embodiment, the substrate 40 may comprise, for example, a printed circuit board in which the printed circuit board is preferably thin. A receiving groove 41 is shown defined on the upper surface of the substrate 40 such that the semiconductor chip 10 can be received or nested within the receiving groove 41. It is preferable that the depth of the receiving groove 41 is substantially the same as the thickness of the semiconductor chip 10. Because the semiconductor chip 10 can be nested within the receiving groove 41 of the substrate 40, the overall volume of the image sensor module 100 can be decreased. It is also possible to prevent or at least minimize the occurrence of the lower surface of the semiconductor chip 10, which exhibits substantial brittleness, from being directly exposed to the outside.

The substrate 40 can also include connection pads 42, ball lands 44 and conductive balls 46.

The connection pads 42 are preferably placed along the upper surface of the substrate 40 around the receiving groove 41. In the present embodiment, the respective connection pads 42 are preferably placed at positions adjacent to the second connection pattern parts 27.

The ball lands 44 are placed along the lower surface of the substrate 40 in which the ball lands 44 face away from the upper surface and are electrically connected with the connection pads 42.

The conductive balls 46 are electrically connected with the ball lands 44. For example, the conductive balls 46 can comprise solder balls containing solder.

In the present embodiment, the connection pads 42 of the substrate 40 and the second connection pattern parts 27 corresponding to the respective connection pads 42 are electrically connected to each other by connection members 45 such as solder.

According to the present illustrative embodiment, because the bonding pads 16 of the semiconductor chip 10 and the connection pads 42 of the substrate 40 which are isolated from each other by the insulation section 22 then the bonding pads 16 and the connection pads 42 can be electrically connected together without using conductive wires. That is, the bonding pads 16 and the connection pads 42 can be electrically connected together by the connection patterns 25 and the connection members 45. As a result, the fabrication time required to manufacture the image sensor module 100 can be significantly decreased, and the volume of the image sensor module 100 can be substantially reduced.

Figure 5:
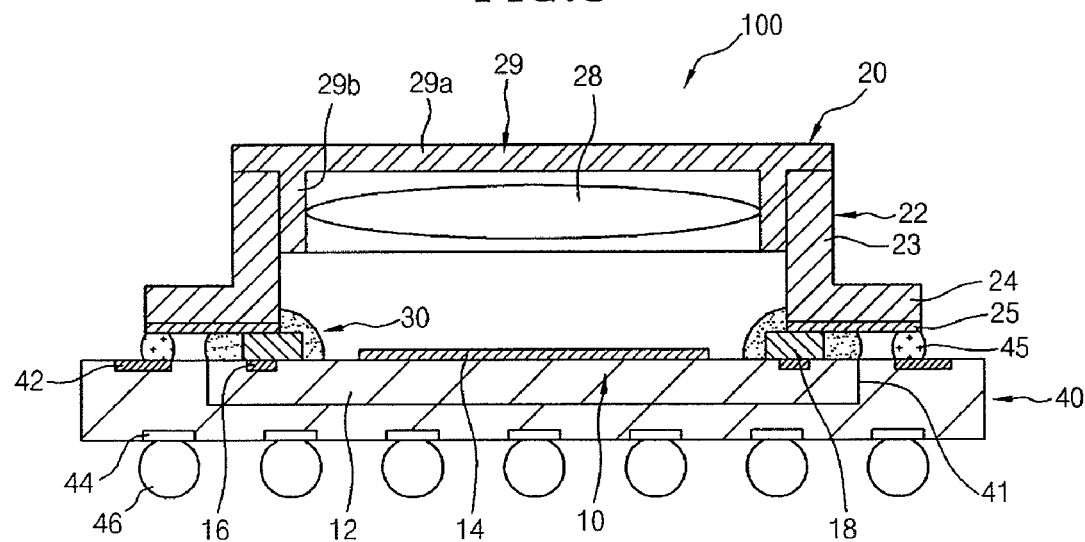
FIG. 5 is a sectional view illustrating an image sensor module in accordance with a second embodiment of the present invention.

FIG. 5 is a sectional view illustrating an image sensor module in accordance with a second embodiment of the present invention. The image sensor module shown in FIG. 5 has substantially the same construction as that of the image sensor module which is described above with reference to FIG. 1, with the exception to an insulation section and connection patterns. Therefore, detailed description for the same component elements will be omitted, and the same technical terms and the same reference numerals will be used to refer to the same or like component elements.

Referring to FIG. 5, an image sensor module 100 includes a semiconductor chip 10, a holder 20 and a coupling member 30. The image sensor module 100 can further include a substrate 40.

Among these component elements, the holder 20 is placed on the semiconductor chip 10. The holder 20 includes an insulation section 22, connection patterns 25 and a transparent cover 29.

The insulation section 22 preferably has a hollow rectangular frame shape which has open upper and lower ends. The insulation section 22 has sidewalls 23 and a bottom plate 24 which preferably has an "L" shape. In the present embodiment, at least portions of the bottom plate 24 of the insulation section 22 is formed by outward away from the lower end portions of the sidewalls 23, and project outward beyond the side surfaces of the semiconductor chip 10.

The sidewalls 23 of the insulation section 22 are preferably placed along four edges of the upper surface of the semiconductor chip body 12. Therefore, there are preferably four sidewalls 23. In the present embodiment, the four sidewalls 23 of the insulation section 22 are connected to one another. The respective sidewalls 23 are preferably placed substantially perpendicular to the upper surface of the semiconductor chip body 12. The insulation section 22 can be made of any type of insulation material. Although it was illustrated and described in the present embodiment that the insulation section 22 has a hollow rectangular frame shape, the insulation section 22 can possess the shape of a hollow cylinder, a hollow ellipse shaped frame, a hollow diamond shaped frame, a hollow triangular shaped frame, a hollow pentagonal and a hollow hexagonal shaped frame.

At least one optical element 28 such as a simple lens, compound lens, a neutral density (ND) filter, an antireflection filter, a polarizing filter, an ultraviolet (UV) cutoff filter, a color filter or an IR filter can be placed inside the sidewalls 23 of the insulation section 22.

The connection patterns 25 are placed on the lower surface of the bottom plate 24 of the insulation section 22. In the present embodiment, portions of the connection patterns 25 are placed on the bumps 18 of the semiconductor chip 10, and other portions of the connection patterns 25 face the connection pads 42 of the substrate 40. In the present embodiment, the connection pads 42 and the connection patterns 25 are electrically connected to each other by means of connection members 45 containing solder.

According to the present embodiment, since the insulation section 22 has an cross sectional "L" shape then the bottom plate 24 extends outward. Accordingly, the structure of the connection patterns 25 can be simplified, and the necessary amount of the connection members 45 can be reduced.

Figure 6:
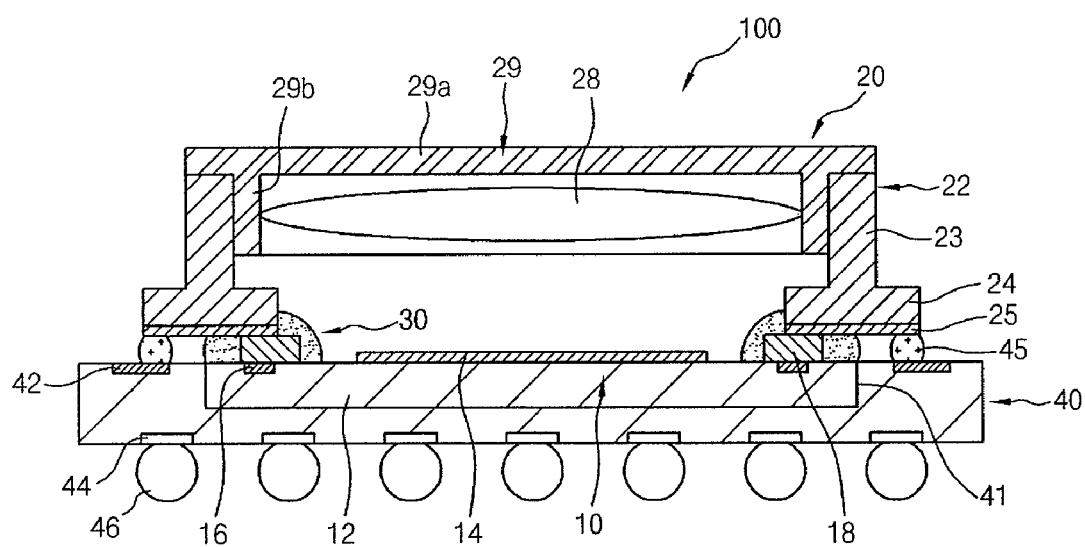
FIG. 6 is a sectional view illustrating an image sensor module in accordance with a third embodiment of the present invention.

FIG. 6 is a sectional view illustrating an image sensor module in accordance with a third embodiment of the present invention. The image sensor module shown in FIG. 6 has substantially the same construction as the image sensor module which is described above with reference to FIG. 1, except with regards to the insulation section and connection patterns. Therefore, detailed description for the same component elements will be omitted, and the same technical terms and the same reference numerals will be used to refer to the same or like component elements.

Referring to FIG. 6, an image sensor module 100 includes a semiconductor chip 10, a holder 20 and a coupling member 30. The image sensor module 100 can further include a substrate 40.

Among these component elements, the holder 20 is placed on the semiconductor chip 10. The holder 20 includes an insulation section 22, connection patterns 25 and a transparent cover 29.

The insulation section 22 has the shape of a hollow rectangular frame which has open upper and lower ends. The insulation section 22 has sidewalls 23 and a bottom plate 24. The insulation section 22 has a cross sectional shape of an inverted "T" shape so that the bottom plate 24 faces the semiconductor chip 10 and extends both inward and outward when viewed from the positions of the sidewalls 23. Accordingly, in the present embodiment, at a least portion of the bottom plate 24 extends outward with respect to the sidewalls 23 and also projects beyond the side surfaces of the semiconductor chip 10.

The sidewalls 23 of the insulation section 22 are placed along the four edges of the upper surface of the semiconductor chip body 12. Therefore, there are four sidewalls 23 in this embodiment. Also in this present embodiment, the four sidewalls 23 of the insulation section 22 are connected to one another. The respective sidewalls 23 are placed substantially perpendicular with respect to the upper surface of the semiconductor chip body 12. The insulation section 22 can be made of any type of insulation material. Although it was illustrated and described in the present embodiment that the insulation section 22 possesses the shape of a hollow rectangular frame, the insulation section 22 can possess the shape of a hollow cylinder shaped frame, a hollow ellipse shaped frame, a hollow diamond shaped frame, a hollow triangular shaped frame, a hollow pentagonal and a hollow hexagonal shaped frame.

At least one optical element 28 such as a simple lens, compound lens, a neutral density (ND) filter, an antireflection filter, a polarizing filter, an ultraviolet (UV) cutoff filter, a color filter or an IR filter can be placed within the confines of the sidewalls 23 of the insulation section 22.

The connection patterns 25 are placed on the overall lower surface of the bottom plate 24 of the insulation section 22. In the present embodiment, portions of the connection patterns 25 are placed on the bumps 18 of the semiconductor chip 10, and other portions of the connection patterns 25 face the connection pads 42 of the substrate 40. In the present embodiment, the connection pads 42 and the connection patterns 25 are electrically connected to each other by means of connection members 45 that preferably contain solder.

According to the present embodiment, since the bottom plate 24 of the insulation section 22 extends both inward and outward with respect to the sidewalls 23, then the structure of the connection patterns 25 can be substantially simplified. It is therefore possible to prevent or at least minimize the occurrence of misalignment between the connection patterns 25 and the bumps 18 and between the connection patterns 25 and the connection pads 42.

Figure 7:
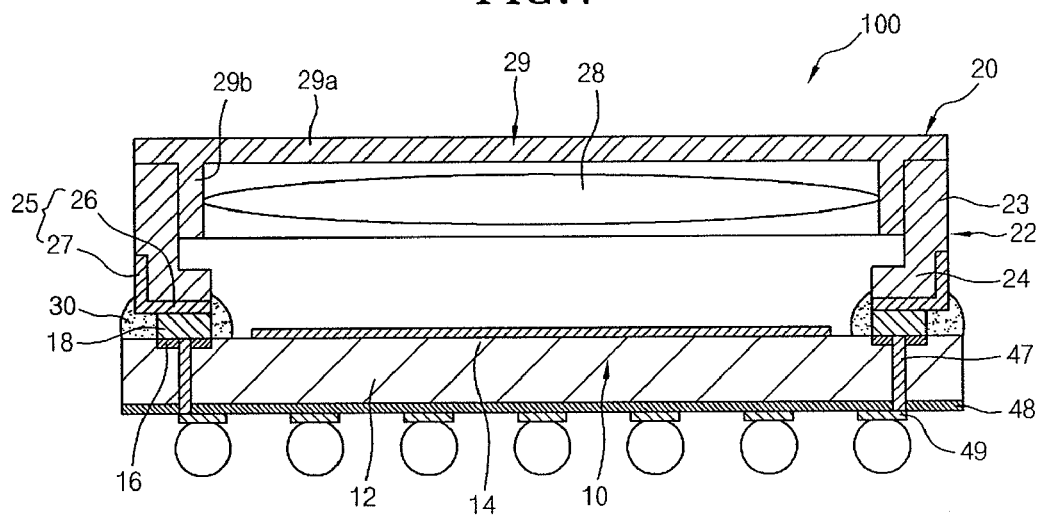
FIG. 7 is a sectional view illustrating an image sensor module in accordance with a fourth embodiment of the present invention.

FIG. 7 is a sectional view illustrating an image sensor module in accordance with a fourth embodiment of the present invention.

Referring to FIG. 7, an image sensor module 100 includes a semiconductor chip 10, a holder 20, a coupling member 30, through-electrodes 47, and redistribution lines 49.

The semiconductor chip 10 includes a semiconductor chip body 12, an image sensing section 14 and bonding pads 16. In the present embodiment, the semiconductor chip 10 can further include bumps 18.

For example, the semiconductor chip body 12 possesses the shape of a rectangular hexahedron. The semiconductor chip body 12 possessing the shape of a rectangular hexahedron has an upper surface and a lower surface which faces away from the upper surface.

The image sensing section 14 is placed on the center portion of the upper surface of the semiconductor chip body 12. The image sensing section 14 includes a plurality of photodiodes (not shown) and a driving unit (not shown) which comprises a plurality of transistors for driving the photodiodes.

The bonding pads 16 are placed on the upper surface of the semiconductor chip body 12. For example, the bonding pads 16 are preferably placed along the peripheries of the image sensing section 14. In detail, the bonding pads 16 are preferably placed along the edges of the upper surface of the semiconductor chip body 12.

The through-electrodes 47 pass through the upper surface and the lower surface, face away from the upper surface, of the semiconductor chip body 12. For example, the through-electrodes 47 pass through the bonding pads 16 of the semiconductor chip body 12.

The redistribution lines 49 are placed on the lower surface of the semiconductor chip body 12. Portions of the redistribution lines 49 are electrically connected with the through-electrodes 47, and solder balls are attached to other portions of the redistribution lines 49.

In the present embodiment, an insulation layer 48 can be interposed between the lower surface of the semiconductor chip body 12 and the redistribution lines 49 while maintaining the electrical connection between the redistribution lines 49 and the through-electrodes 47.

The bumps 18 are placed on the respective bonding pads 16 through which the through-electrodes 47 pass. The bumps 18 can preferably comprise gold bumps and/or nickel bumps.

The holder 20 is placed over the semiconductor chip 10. The holder 20 includes an insulation section 22, connection patterns 25 and a transparent cover 29.

The insulation section 22 has the shape of a hollow rectangular frame which has open upper and lower ends. The insulation section 22 has sidewalls 23 and a bottom plate 24 which is formed by bending inward the lower end portions of the sidewalls 23 facing the semiconductor chip 10.

The sidewalls 23 of the insulation section 22 are placed along the four edges of the upper surface of the semiconductor chip body 12. Therefore, there are four sidewalls 23 in the present embodiment, in which the four sidewalls 23 of the insulation section 22 are connected to one another. The respective sidewalls 23 are placed substantially perpendicular with respect to the upper surface of the semiconductor chip body 12. For example, the insulation section 22 can be made of any type of insulation material. Although it was illustrated and described in the present embodiment that the insulation section 22 possesses the shape of a hollow rectangular frame, the insulation section 22 can possess the shape of a hollow cylinder shaped frame, a hollow ellipse shaped frame, a hollow diamond shaped frame, a hollow triangular shaped frame, a hollow pentagonal and a hollow hexagonal shaped frame.

At least one optical element 28 such as a simple lens, a compound lens, a neutral density (ND) filter, an antireflection filter, a polarizing filter, an ultraviolet (UV) cutoff filter, a color filter or an IR filter can be placed inside the sidewalls 23 of the insulation section 22.

The connection patterns 25 include first connection pattern parts 26 and second connection pattern parts 27. The first connection pattern parts 26 are placed on the lower surface of the bottom plate 24 of the insulation section 22, and the second connection pattern parts 27 are placed on the side surfaces of the bottom plate 24 of the insulation section 22. The respective first connection pattern parts 26 and the corresponding second connection pattern parts 27 are electrically connected to each other. Thus, when viewed in section, the cross section of the connection patterns 25 have the 'L' shape.

In the present embodiment, the first connection patterns parts 26 of the connection patterns 25 are placed on the lower surface of the bottom plate 24 at positions corresponding to the respective bumps 18 of the semiconductor chip 10. Therefore, the respective first connection pattern parts 26 are placed on the respective bumps 18 of the semiconductor chip 10.

The transparent cover 29 has a cover part 29a and a coupling part 29b.

The cover part 29a possesses the shape of a transparent plate and is placed to face the image sensing section 14 of the semiconductor chip 10. The coupling part 29b extends from the cover part 29a and is fitted inside the sidewalls 23 of the insulation section 22.

The transparent cover 29 prevents or at least minimizes the introduction of foreign substances into the image sensing section 14 and allows external light rays to reach the image sensing section 14.

The coupling member 30 physically and/or electrically couples together the connection patterns 25 and the bumps 18 of the semiconductor chip 10 to each other. In the present embodiment, the coupling member 30 is preferably formed in a closed line along the bottom plate 24 of the insulation section 22. The coupling member 30 prevents or at least minimizes the occurrence of external contaminants from entering the holder 20 and the image sensing section 14.

In the present embodiment, examples of materials which can be used to form the coupling member 30 include a nonconductive adhesive (NCA), a nonconductive film (NCF), and an anisotropic conductive film (ACF).

According to the present embodiment, since the through-electrodes 47 pass through the semiconductor chip 10 and are electrically connected to the redistribution lines 49 which are at the lower surface of the semiconductor chip 10. The solder balls are attached to the redistribution lines 49. Therefore, it is possible to realize an image sensor module having a small size.

Figure 8:
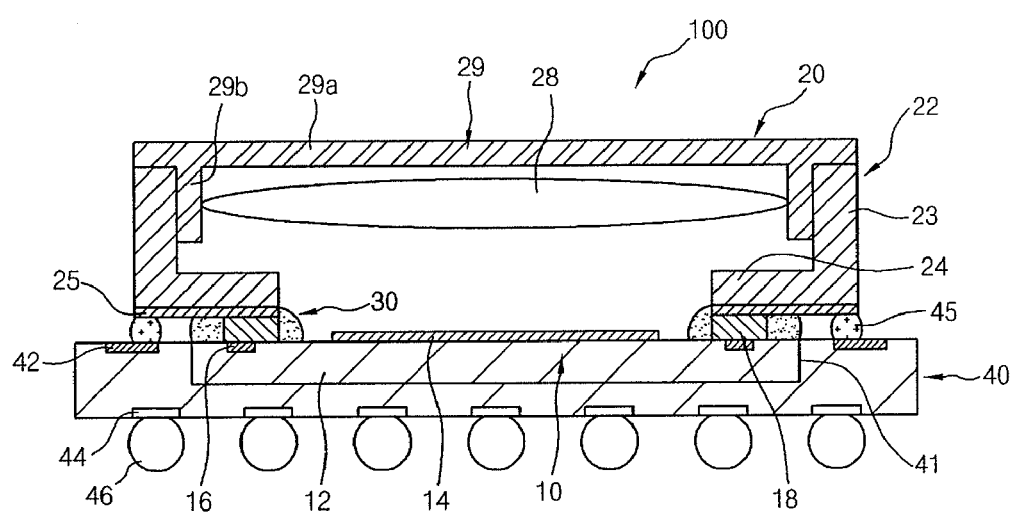
FIG. 8 is a sectional view illustrating an image sensor module in accordance with a fifth embodiment of the present invention.

FIG. 8 is a sectional view illustrating an image sensor module in accordance with a fifth embodiment of the present invention.

Referring to FIG. 8, an image sensor module 100 includes a semiconductor chip 10, a holder 20, a coupling member 30, and a substrate 40.

The semiconductor chip 10 includes a semiconductor chip body 12, an image sensing section 14 and bonding pads 16. In the present embodiment, the semiconductor chip 10 can further include bumps 18.

For example, the semiconductor chip body 12 possesses the shape of a rectangular hexahedron. The semiconductor chip body 12 possessing the shape of a rectangular hexahedron has an upper surface and a lower surface which faces away from the upper surface.

The image sensing section 14 is placed, for example, on the center portion of the upper surface of the semiconductor chip body 12. The image sensing section 14 includes a plurality of photodiodes (not shown) and a driving unit (not shown) which comprises a plurality of transistors for driving the photodiodes.

The bonding pads 16 are preferably placed on the upper surface of the semiconductor chip body 12. For example, the bonding pads 16 are preferably placed along the peripheries of the image sensing section 14. In detail, the bonding pads 16 are preferably placed along the edges of the upper surface of the semiconductor chip body 12.

The bumps 18 are preferably placed directly over their respective corresponding bonding pads 16. The bumps 18 can comprise any type of electrical conductive material such as being made of gold bumps and/or nickel bumps.

The substrate 40 is coupled to the semiconductor chip 10. In the present embodiment, the substrate 40 may comprise, for example, a thin printed circuit board. A receiving groove 41 is preferably defined on the upper surface of the substrate 40 such that the semiconductor chip 10 can be received and nested within the receiving groove 41. It is preferable that the depth of the receiving groove 41 is substantially the same as the thickness of the semiconductor chip 10. Because the semiconductor chip 10 is received in the receiving groove 41 of the substrate 40, then the overall volume of the image sensor module 100 can be reduced. Thereby making it possible to prevent or at least minimize exposure of the brittle lower surface of the semiconductor chip 10 from being directly exposed to the outside.

The substrate 40 includes connection pads 42, ball lands 44 and conductive balls 46.

The connection pads 42 are preferably placed on the upper surface of the substrate 40 around the receiving groove 41. In the present embodiment, the respective connection pads 42 are preferably placed at positions corresponding to the bonding pads 16 of the semiconductor chip 10.

The ball lands 44 are placed on the lower surface of the substrate 40 and are electrically connected with the connection pads 42. The conductive balls 46 are electrically connected with the ball lands 44. The conductive balls 46 can be composed of any type of conductive material such as comprising solder balls containing solder.

The holder 20 includes an insulation section 22, connection patterns 25 and a transparent cover 29.

The insulation section 22 has the shape of a hollow rectangular frame which has open upper and lower ends. The insulation section 22 has sidewalls 23 and a bottom plate 24 which is formed by bending inward the lower end portions of the sidewalls 23.

The sidewalls 23 of the insulation section 22 are placed along the four edges of the upper surface of the semiconductor chip body 12. Therefore, there are four sidewalls 23 of the insulation section 22 which are connected to one another. The respective sidewalls 23 are placed substantially perpendicular to the upper surface of the semiconductor chip body 12. The insulation section 22 can be made of an insulation material. Although it was illustrated and described in the present embodiment that the insulation section 22 possesses the shape of a hollow rectangular frame, the insulation section 22 can possess the shape of a hollow cylinder shaped frame, a hollow ellipse shaped frame, a hollow diamond shaped frame, a hollow triangular shaped frame, a hollow pentagonal and a hollow hexagonal shaped frame.

At least one optical element 28 such as a simple lens, compound lens, a neutral density (ND) filter, an antireflection filter, a polarizing filter, an ultraviolet (UV) cutoff filter, a color filter or an IR filter can be placed inside the sidewalls 23 of the insulation section 22.

The connection patterns 25 are placed on the lower surface of the bottom plate 24 of the insulation section 22.

In the present embodiment, the connection patterns 25 face the bumps 18 of the semiconductor chip 10 and the connection pads 42 which respectively correspond to the bumps 18. The connection pads 42 and the connection patterns 25 are electrically connected with each other by connection members 45 in which the connection members 45 preferably comprise solder and solder balls.

The transparent cover 29 has a cover part 29a and a coupling part 29b.

The cover part 29a is preferably a transparent plate and is placed to face the image sensing section 14 of the semiconductor chip 10. The coupling part 29b extends from the cover part 29a and is fitted within the confines of the sidewalls 23 of the insulation section 22.

The transparent cover 29 prevents or at least minimizes foreign substances from being introduced into the image sensing section 14. The transparent cover 29 allows external light rays to transmit through it to eventually reach the image sensing section 14.

The coupling member 30 physically and/or electrically couples the connection patterns 25 and the bumps 18 to each other. In the present embodiment, the coupling member 30 is preferably formed in a closed line along the bottom plate 24 of the insulation section 22. The coupling member 30 prevents or at least minimizes external contaminants from entering the holder 20 and the image sensing section 14.

In the present embodiment, examples of materials which can be used to form the coupling member 30 include a nonconductive adhesive (NCA), a nonconductive film (NCF), and an anisotropic conductive film (ACF).

The embodiment as shown in FIG. 8 can be advantageously applied when the area of the holder 20 and/or the optical element 28 is greater than the area of the semiconductor chip 10.

Figure 9:
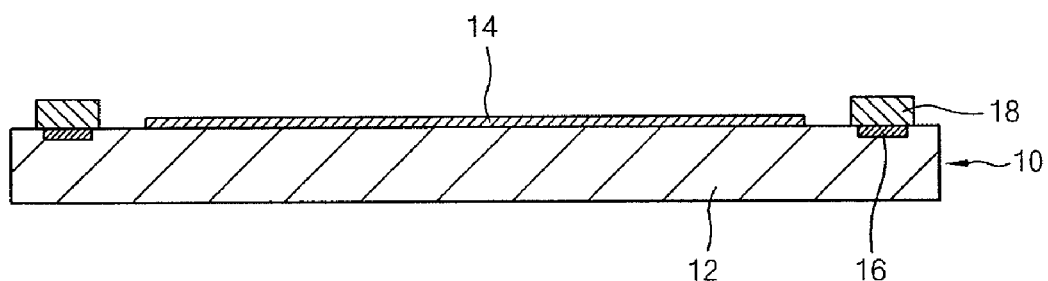
FIGS. 9 through 11 are sectional views illustrating a method for manufacturing the image sensor module according to the present invention.
Figure 10:
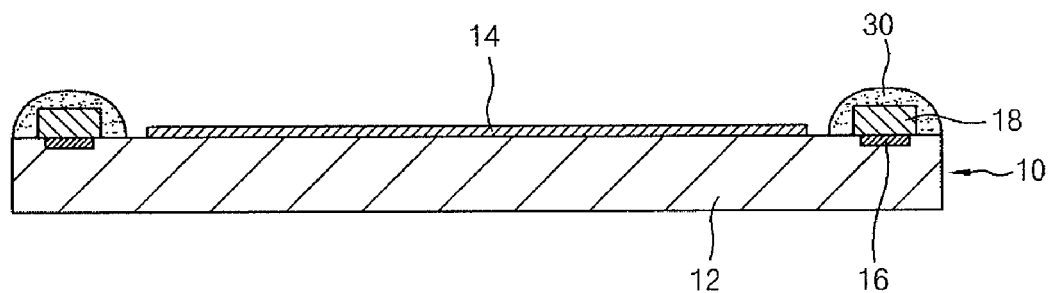
Figure 11:
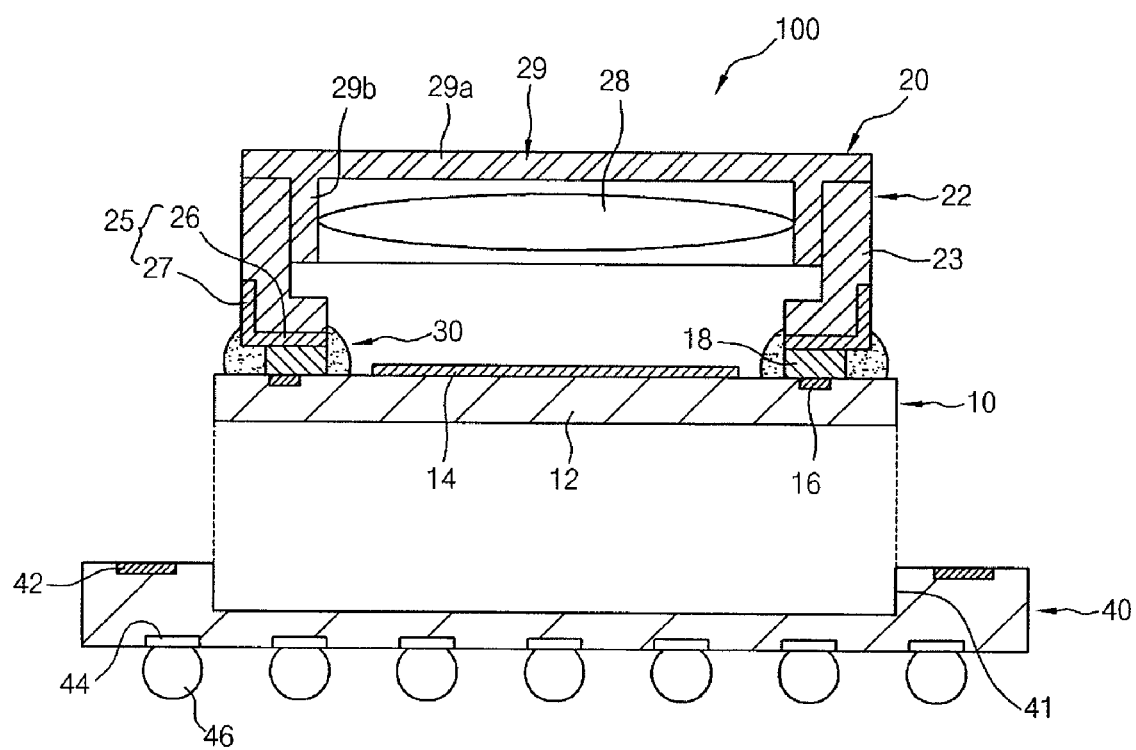

FIGS. 9 through 11 are sectional views illustrating a method for manufacturing the image sensor module according to the present invention.

FIG. 9 is a sectional view illustrating a semiconductor chip used for manufacturing an image sensor module.

Referring to FIG. 9, in order to manufacture an image sensor module, for example, a semiconductor chip 10 is preferably prepared first.

An image sensing section 14 and bonding pads 16 are formed on the upper surface of a semiconductor chip body 12 of the semiconductor chip 10 which has a rectangular hexahedron shape. Bumps 18 are formed on the bonding pads 16.

The image sensing section 14 is preferably formed on the center portion of the upper surface of the semiconductor chip body 12. The image sensing section 14 includes a plurality of photodiodes (not shown) and a driving unit (not shown) which comprises a plurality of transistors for driving the photodiodes.

The bonding pads 16 which are formed on the upper surface of the semiconductor chip body 12 are preferably placed along the peripheries of the image sensing section 14. In detail, the bonding pads 16 are preferably placed along the edges of the upper surface of the semiconductor chip body 12.

The bumps 18 which are formed on the respective bonding pads 16 preferably comprise gold bumps and/or nickel bumps.

Referring to FIG. 10, after the bumps 18 are formed on the semiconductor chip 10, a coupling member 30 is formed in the form of a closed line along the edges of the upper surface of the semiconductor chip 10. Examples of materials which can be used to form the coupling member 30 include a nonconductive adhesive (NCA), a nonconductive film (NCF), and an anisotropic conductive film (ACF).

Referring to FIG. 11, a holder 20 is shown formed on the semiconductor chip 10.

An insulation section 22 of the holder 20 has the shape of a hollow rectangular frame which has open upper and lower ends. The lower ends of sidewalls 23 of the insulation section 22, which face the semiconductor chip 10, are bent inward, such that a bottom plate 24 is formed to be perpendicular to the sidewalls 23.

At least one optical element 28 such as a simple lens, compound lens, a neutral density (ND) filter, an antireflection filter, a polarizing filter, an ultraviolet (UV) cutoff filter, a color filter or an IR filter can be placed inside the sidewalls 23 of the insulation section 22.

Connection patterns 25 are preferably formed on the side surfaces and the lower surface of the bottom plate 24 of the insulation section 22. The connection patterns 25 are preferably formed to have first connection pattern parts 26 and second connection pattern parts 27.

The first connection pattern parts 26 are placed on the lower surface of the bottom plate 24 of the insulation section 22, and the second connection pattern parts 27 are placed on the side surfaces of the bottom plate 24 of the insulation section 22. The respective first connection pattern parts 26 and the corresponding second connection pattern parts 27 are preferably formed integrally with each other. When viewed in section, the connection patterns 25 have an 'L' shape.

In the present embodiment, the first connection pattern parts 26 of the connection patterns 25 are arranged on the bottom plate 24 at positions which correspond to the respective bumps 18 of the semiconductor chip 10. The first connection pattern parts 26 and the bumps 18 are electrically connected with each other by the medium of the coupling member 30. The coupling member 30 can electrically or physically connect the bumps 18 and the first connection pattern parts 26.

The transparent cover 29 has a cover part 29a and a coupling part 29b. The cover part 29a preferably has a transparent plate shape and is formed at a position which faces the image sensing section 14 of the semiconductor chip 10. The coupling part 29b extends from the cover part 29a and is fitted within the confines of the inside the sidewalls 23 of the insulation section 22.

The transparent cover 29 prevents or at least minimizes foreign substances from being introduced into the image sensing section 14 and allows external light rays to reach the image sensing section 14.

The semiconductor chip 10 and the holder 20 which are coupled to each other are mounted to a substrate 40.

The substrate 40 may comprise, for example, a thin printed circuit board. A receiving groove 41 is defined on the upper surface of the substrate 40 such that the semiconductor chip 10 can be received and nested within the receiving groove 41. The depth of the receiving groove 41 can preferably be substantially the same as the thickness of the semiconductor chip 10.

Due to the fact that the semiconductor chip 10 is received in the receiving groove 41 of the substrate 40, the overall volume of the image sensor module 100 can be decreased. Accordingly, it is possible to prevent or at least minimize exposure to the outside of the lower surface of the brittle semiconductor chip 10.

The substrate 40 includes connection pads 42, ball lands 44 and conductive balls 46. The connection pads 42 are placed on the upper surface of the substrate 40.

The connection pads 42 are placed around the receiving groove 41. In the present embodiment, the respective connection pads 42 can be placed at positions corresponding to the second connection pattern parts 27.

The ball lands 44 are preferably placed on the lower surface of the substrate 40 which faces away from the upper surface and are electrically connected with the connection pads 42.

The conductive balls 46 are electrically connected with the ball lands 44. For example, the conductive balls 46 can preferably comprise solder balls containing solder.

In the present embodiment, the connection pads 42 of the substrate 40 and the second connection pattern parts 27 corresponding to the respective connection pads 42 are electrically connected with each other by connection members 45 such as solder.

As is apparent from the above description, in the present invention, a time required for manufacturing an image sensor module can be significantly shortened, and the volume of the image sensor module can be remarkably decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. An image sensor module comprising:
   a semiconductor chip comprising:
      a semiconductor chip body,
      an image sensing section over the semiconductor chip body, and
      bonding pads on the semiconductor chip body;
   a holder over the semiconductor chip, the holder including:
      an insulation section over the semiconductor chip body,
      L-shaped connection patterns on the insulation section, the L-shaped connection patterns electrically coupled to the bonding pads, and
      a transparent cover over the image sensing section and connected to the insulation section; and
   a coupling member interposed between the holder and the semiconductor chip to couple the holder to the semiconductor chip.

2. The image sensor module according to claim 1, wherein the coupling member comprises any one of a nonconductive adhesive (NCA), a nonconductive film (NCF), and an anisotropic conductive film (ACF).

3. The image sensor module according to claim 1, further comprising bumps interposed between the bonding pads and the L-shaped connection patterns and electrically interconnecting the bonding pads and the L-shaped connection patterns respectively with each other.

4. The image sensor module according to claim 1, further comprising an optical element over the image sensing section.

5. The image sensor module according to claim 4 wherein the optical element is selected from the group consisting of a simple lens, compound lens, a neutral density (ND) filter, an antireflection filter, a polarizing filter, an ultraviolet (UV) cutoff filter, a color filter, an infrared (IR) filter, and combinations thereof.

6. The image sensor module according to claim 1, further comprising a substrate placed on a lower surface of the semiconductor chip body, the substrate having connection pads electrically connected to the L-shaped connection patterns.

7. The image sensor module according to claim 6, wherein the semiconductor chip body is nested within a receiving groove of the substrate.

8. The image sensor module according to claim 6, further comprising connection members electrically connecting together the second L-shaped connection patterns of the holder to the connection pads of the substrate.

9. The image sensor module according to claim 1, further comprising:
   ball lands electrically connected to respective bonding pads, the ball lands on the semiconductor chip body; and
   conductive members connected with the ball lands.

10. The image sensor module according to claim 9, further comprising through-electrodes passing through the semiconductor chip which electrically connect the bonding pads and the ball lands to each other.

11. An image sensor module comprising:
   a semiconductor chip comprising:
      a semiconductor chip body,
      an image sensing section over the semiconductor chip body, and
      bonding pads on the semiconductor chip body;
   a substrate attached to a lower surface of the semiconductor chip, the substrate having connection pads which correspond to the respective bonding pads;
   a holder over the substrate, the holder including:
      an insulation section which is erected on the substrate,
      a bottom plate connected with the insulation section and placed in parallel to the semiconductor chip,
      L-shaped connection patterns on the bottom plate that are electrically connect to the bonding pads and to the connection pads, and
      a transparent cover covering the image sensing section, the transparent cover coupled to the insulation section; and
   a coupling member interposed between the holder and the substrate coupling together the holder to the substrate.

12. The image sensor module according to claim 11, wherein the coupling member comprises any one of a nonconductive adhesive (NCA), a nonconductive film (NCF), and an anisotropic conductive film (ACF).

13. The image sensor module according to claim 11, further comprising bumps interposed between the bonding pads and the L-shaped connection patterns and the bumps electrically connecting together the bonding pads and the L-shaped connection patterns.

14. The image sensor module according to claim 11, wherein the semiconductor chip body is nested within a receiving groove of the substrate.

15. The image sensor module according to claim 11, further comprising an optical element over the image sensing section.

16. The image sensor module according to claim 15, wherein the optical element is selected from the group consisting of a simple lens, compound lens, a neutral density (ND) filter, an antireflection filter, a polarizing filter, an ultraviolet (UV) cutoff filter, a color filter, an IR filter, and combinations thereof.

17. An image sensor module comprising:
a substrate having connection pads and a receiving groove;
a semiconductor chip comprising:
   a semiconductor chip body nested within the receiving groove of the substrate;
   an image sensing section over the semiconductor chip body;
   bonding pads nested within the semiconductor chip body; and
   bumps on the semiconductor chip body electrically coupled to respective bonding pads;
a holder over the semiconductor chip, the holder including:
   an insulation section over the semiconductor chip body;
   connection patterns on the insulation section, the connection patterns electrically coupled to the bonding pads; and
   a transparent cover over the image sensing section and connected
to the insulation section; and
an anisotropic conductive film (ACF) coupling member interposed between the connection patterns of the holder and the bumps of semiconductor chip that physically couples the holder to the semiconductor chip and that electrically couples together the connection patterns to respective bonding pads.

18. The image sensor module according to claim 17, wherein the ACF coupling member forms a closed line along the insulation section which minimizes external contaminants from entering the holder and the image sensing section.

19. The image sensor module according to claim 17, further comprising an optical element over the image sensing section, wherein the optical element is selected from the group consisting of a simple lens, compound lens, a neutral density (ND) filter, an antireflection filter, a polarizing filter, an ultraviolet (UV) cutoff filter, a color filter, an IR filter, and combinations thereof.

20. The image sensor module according to claim 17, further comprising:
ball lands on the substrate electrically coupled to respective bonding pads; and
conductive members connected with the ball lands.

* * * * *